United States Patent
Yu

(10) Patent No.: US 7,745,933 B2
(45) Date of Patent: Jun. 29, 2010

(54) CIRCUIT STRUCTURE AND PROCESS THEREOF

(75) Inventor: Cheng-Po Yu, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 15 days.

(21) Appl. No.: 11/739,515

(22) Filed: Apr. 24, 2007

(65) Prior Publication Data

US 2008/0179744 A1 Jul. 31, 2008

(30) Foreign Application Priority Data

Jan. 25, 2007 (TW) .............................. 96102835 A

(51) Int. Cl.
*H01L 23/48* (2006.01)
*H01L 23/52* (2006.01)
*H01L 29/40* (2006.01)

(52) U.S. Cl. ...................... 257/750; 257/744; 257/758; 257/E21.495; 257/E23.01

(58) Field of Classification Search ................ 257/750, 257/774, E21.495, E23.01
See application file for complete search history.

(56) References Cited

U.S. PATENT DOCUMENTS

| 2002/0145203 A1* | 10/2002 | Adae-Amoakoh et al. | .. 257/778 |
| 2007/0281464 A1* | 12/2007 | Hsu | .......................... 438/624 |
| 2008/0001297 A1* | 1/2008 | Lotz et al. | ................... 257/774 |
| 2008/0006945 A1* | 1/2008 | Lin et al. | .................... 257/758 |

* cited by examiner

*Primary Examiner*—Cuong Q Nguyen
*Assistant Examiner*—Cathy N Lam
(74) *Attorney, Agent, or Firm*—J.C. Patents

(57) ABSTRACT

A circuit structure has a first dielectric layer, a first circuit pattern embedded in the first dielectric layer and having a first via pad, a first conductive via passing through the first dielectric layer and connecting to the first via pad, and an independent via pad disposed on a surface of the first dielectric layer away from the first via pad and connecting to one end of the first conductive via. The circuit structure further has a second dielectric layer disposed over the surface of the first dielectric layer where the independent via pad is disposed, a second conductive via passing through the second dielectric layer and connecting to the independent via pad, and a second circuit pattern embedded in the second dielectric layer, located at a surface thereof away from the independent via pad, and having a second via pad connected to the second conductive via.

16 Claims, 6 Drawing Sheets

CIRCUIT STRUCTURE AND PROCESS THEREOF

CROSS-REFERENCE TO RELATED APPLICATION

This application claims the priority benefit of Taiwan application serial no. 96102835, filed Jan. 25, 2007. All disclosure of the Taiwan application is incorporated herein by reference.

BACKGROUND OF THE INVENTION

1. Field of the Invention

The present invention relates to a circuit structure, and more particularly to a circuit structure and process thereof.

2. Description of Related Art

The kinds of circuit boards normally used inside an electronic apparatus include the rigid circuit board and the flexible circuit board. The dielectric layer of a rigid circuit board is made from a strong and tough material for carrying and electrically connecting electronic components located on a single plane. The dielectric layer of a flexible circuit board is made from a flexible material for electrically connecting two electronic components located on different planes. Due to spatial limitation or other factors, the rigid circuit board and the flexible circuit board may be combined and applied together.

Conventionally, the techniques for fabricating a rigid circuit board (from now on, the circuit board) include the lamination process and the build-up process.

In the lamination process, circuit patterns are separately fabricated on dielectric layers. The circuit patterns, the dielectric layers on which the circuit patterns are disposed, and a dielectric layer for connection are aligned and pressed in a single operation to form the circuit board. Next, a conductive through via process is performed to fabricate conductive through vias for electrically connecting the circuit patterns located in different layer counts.

In the build-up process, circuit patterns and dielectric layers are alternately fabricated on a core in sequence. In addition, conductive blind via processes are also performed in the process of fabricating the circuit patterns and the dielectric layers so that conductive blind vias for connecting the circuit patterns in different layer counts are formed.

Regardless of whether the lamination process or the build-up process is used, the conductive via process fabricates a conductive via by forming an opening in a single operation and then filling the opening with conductive material. However, this method of performing a single operation to form each opening is disadvantageous to fabricating a conductive via with a high aspect ratio.

SUMMARY OF THE INVENTION

Accordingly, the present invention provides a circuit structure for a conductive via with a high aspect ratio.

The present invention also provides a circuit structure that uses two-stage process to fabricate a single conductive channel for electrically connecting two circuit patterns in different layer counts.

As embodied and broadly described herein, the present invention provides a circuit structure. The circuit structure includes a first dielectric layer, a first circuit pattern, at least one first conductive via and at least one independent via pad. The first circuit pattern is embedded in the first dielectric layer and has at least one first via pad. The first conductive via passes through the first dielectric layer and connects to the first via pad. The independent via pad is disposed on a surface of the first dielectric layer away from the first via pad and connects to one end of the first conductive via. The circuit structure further includes a second dielectric layer, at least one second conductive via and a second circuit pattern. The second dielectric layer is disposed over the surface of the first dielectric layer where the independent via pad is disposed. The second conductive via passes through the second dielectric layer and connects to the independent via pad. The second circuit pattern is embedded in the second dielectric layer and located at a surface of the second dielectric layer away from the independent via pad. The second circuit pattern has at least one second via pad connected to the second conductive via.

In an embodiment of the present invention, the outer diameter of the independent via pad may be greater than an outer diameter of the first via pad.

In an embodiment of the present invention, the outer diameter of the independent via pad may be greater than an outer diameter of the second via pad.

The present invention also provides a process for forming a circuit structure. First, a composite-layer structure including a first carrier substrate, a first circuit pattern, a first dielectric layer, at least one first conductive via and at least one independent via pad is provided. The first circuit pattern including at least one first via pad is disposed on the first carrier substrate. The first dielectric layer is disposed over the first carrier substrate and the first circuit pattern. Furthermore, the first circuit pattern is embedded in the first dielectric layer. The first conductive via passes through the first dielectric layer and connects with the first via pad. The independent via pad is located at one end of the first conductive via away from the first via pad. Furthermore, the first conductive via connects the independent via pad and the first via pad. In addition, a second composite-layer structure including a second carrier substrate and a second circuit pattern is also provided. The second circuit pattern is disposed on the second carrier substrate. Next, the first composite-layer structure, a second dielectric layer and the second composite-layer structure are pressed together such that the second circuit pattern and the independent via pad are embedded in the second dielectric layer and the second dielectric layer is connected to the first dielectric layer. Next, the first carrier substrate and the second carrier substrate are removed to expose the first circuit pattern and the second circuit pattern. After that, at least one first opening that passes through the second dielectric layer and exposes the independent via pad is formed. Next, conductive material is used to fill the first opening so as to form a second conductive via that connects the independent via pad and the second via pad. In an embodiment of the present invention, the outer diameter of the independent via pad may be greater than the outer diameter of the first via pad.

In an embodiment of the present invention, the second circuit pattern may have a ring-shape pad. When the conductive material is being used to fill the first opening, the conductive material filling an empty space surrounded by the ring-shape pad and the ring-shape pad form a second via pad. In addition, the outer diameter of the independent via pad may be greater than the outer diameter of the second via pad.

In an embodiment of the present invention, the process for providing the foregoing first composite-layer structure includes the following steps. First, a first circuit pattern is formed on the first carrier substrate. Next, a first dielectric layer is formed over the first carrier substrate and the first circuit pattern. After that, a conductive layer is formed upon the first dielectric layer. At least one second opening that passes through the conductive layer and the first dielectric layer and exposes the first via pad is formed. Subsequently, conductive material is used to fill the second opening so as to form a first conductive via. The conductive via connects the first via pad and the conductive layer. Finally, the conductive layer is patterned to form the independent via pad.

In an embodiment of the present invention, another process for providing the foregoing first composite-layer structure includes the following steps. First, a first circuit pattern is formed on the first carrier substrate. Next, a first dielectric layer is formed over the first carrier substrate and the first circuit pattern. After that, at least one second opening that passes through the first dielectric layer and exposes the first via pad is formed. A patterned mask is formed on the first dielectric layer. The patterned mask has a mask opening that exposes the second opening. Next, conductive material is used to fill the second opening so as to form a first conductive via that connects to the first via pad, and then conductive material is used to fill the mask opening so as to form an independent via pad. Finally, remove the patterned mask.

In an embodiment of the present invention, another process for providing the foregoing second composite-layer structure is forming the second circuit pattern on the second carrier substrate.

Accordingly, the present invention fabricates a single conductive channel for electrically connecting two circuit patterns in different layers through a two-stage process. Hence, the conductive vias of a circuit structure may have a higher aspect ratio, thereby increasing the circuit density of the circuit structure or fitness to the design of special circuit structures. In addition, the outer diameter of the independent via pad may be greater than the outer diameter of the via pad above or below the independent via pad so as to enhance the tolerance of alignment between two circuit patterns, one above and one below the independent via pad. As a result, the process yield of the circuit structure is increased and the heat dissipating capacity of the circuit structure is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
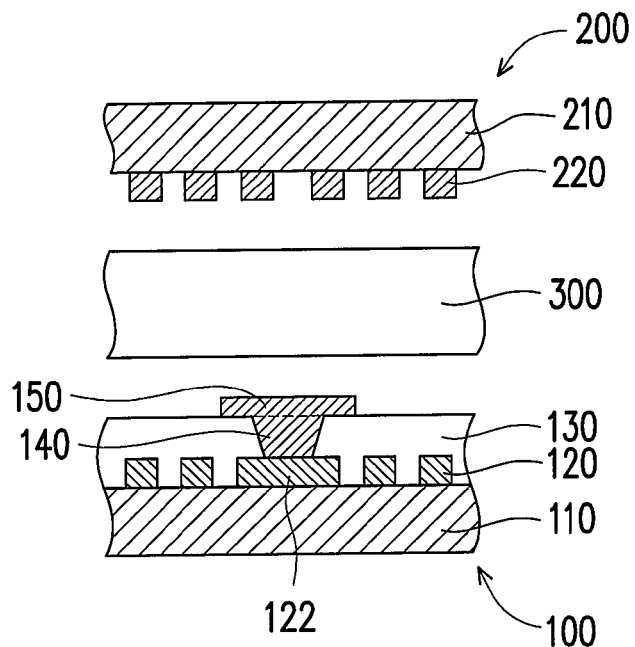
FIGS. 1A to 1E illustrate a process for fabricating a circuit structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIGS. 1A to 1E illustrate a process for fabricating a circuit structure according to an embodiment of the present invention. As shown in FIG. 1A, a first composite-layer structure 100 is provided. The first composite-layer structure 100 has a first carrier substrate 110 and a first circuit pattern 120. The first circuit pattern 120 including at least one first via pad 122 is disposed upon the first carrier substrate 110. The first composite-layer structure 100 further includes a first dielectric layer 130 covering the first carrier substrate 110 and the first circuit pattern 120. Furthermore, the first circuit pattern 120 is embedded in the first dielectric layer 130. The first composite-layer structure 100 also includes at least one first conductive via 140 that passes through the first dielectric layer 130 and connects to the first via pad 122.

The first composite-layer structure 100 also includes at least one independent via pad 150 located at one end of the first conductive via 140 away from the first via pad 122. Moreover, the first conductive via 140 connects the independent via pad 150 and the first via pad 122. It shall be noted that the independent via pad 150 refers to the via pad having no connection with any conductive wire in a layer where the via pad is disposed.

As shown in FIG. 1A, a second composite-layer structure 200 is also provided. The second composite-layer structure 200 has a second carrier substrate 210 and a second circuit pattern 220. The second circuit pattern 220 is disposed on the second carrier substrate 210. In the present embodiment, the second circuit pattern 220 may be fabricated upon the second carrier substrate 210 by performing an additive process, a semi-additive process or a subtractive process.

Figure 1B:
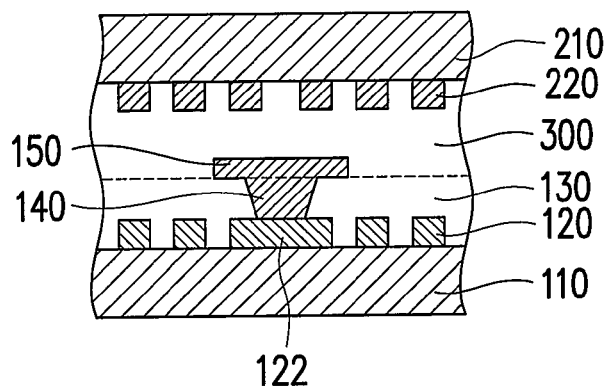

As shown in FIG. 1B, the first composite-layer structure 100, the second dielectric layer 300 and the second composite-layer structure 200 are pressed together so as to embed the second circuit pattern 220 and the independent via pad 150 in the second dielectric layer 300 and connect the second dielectric layer 300 to the first dielectric layer 130. In the present embodiment, the material of the second dielectric layer 300 may be a resin. Furthermore, heat may be simultaneously applied to the second dielectric layer 300 in the pressing process so that the independent via pad 150 is embedded in the second dielectric layer 300.

Figure 1C:
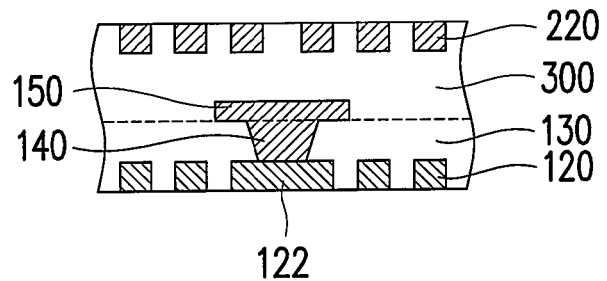

As shown in FIG. 1C, remove the first carrier substrate 110 and the second carrier substrate 210 to expose the first circuit pattern 120 and the second circuit pattern 220. Therefore, the first circuit pattern 120 is embedded in the first dielectric layer 130 and located at a surface of the first dielectric layer 130 away from the independent via pad 150, while the second circuit pattern 220 is embedded in the second dielectric layer 300 and located at a surface of the second dielectric layer 300 away from the independent via pad 150.

Figure 1D:
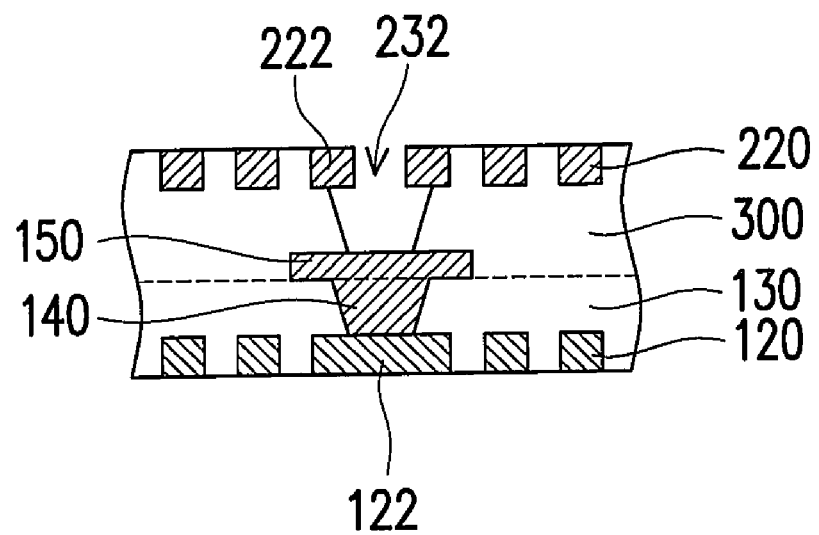

As shown in FIG. 1D, at least one first opening 232 that passes through the second dielectric layer 300 and exposes the independent via pad 150 is formed. In the present embodiment, the method of forming the first opening 232 is performing a laser-drilling operation, for example.

Figure 1E:
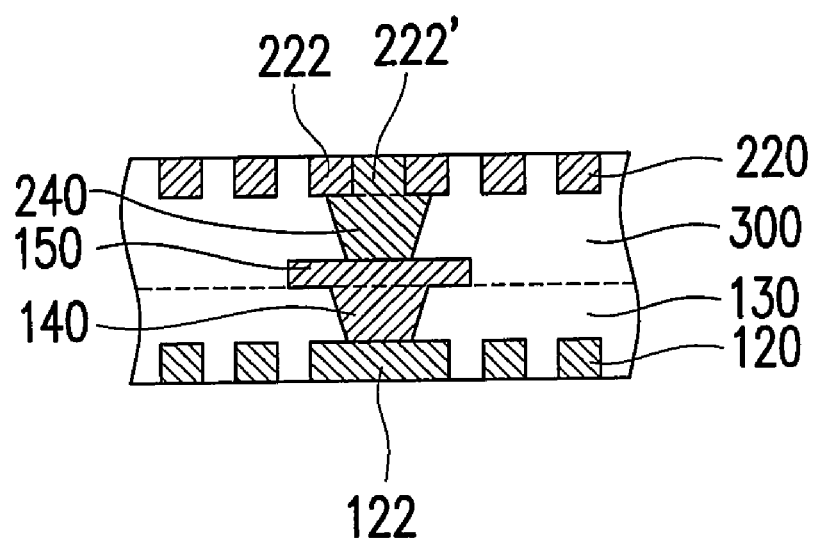

As shown in FIG. 1E, conductive material is used to fill the first opening 232 so as to form a second conductive via 240 that connects the independent via pad 150 and the second circuit pattern 220. Here, the second conductive via 240, the independent via pad 150 and the first conductive via 140 may be regarded as a conductive channel. In the present embodiment, the method of filling the first opening 232 with conductive material is performing an electroplating process, for example.

When an electroplating process is performed to fill the first opening 232 with conductive material, an electroplated layer (not shown) is formed on the second dielectric layer 300 and the second circuit pattern 220. This electroplated layer must be removed to prevent a short circuit of the second circuit pattern 220.

As shown in FIG. 1E, the independent via pad 150 in the present embodiment may be fabricated in such a way that the outer diameter of the independent via pad 150 is greater than that of the first via pad 122. This may increase the tolerance of alignment between the first circuit pattern 120 and the second circuit pattern 220 and improve the corresponding process yield.

In the present embodiment, the second circuit pattern 220 has a ring-shape pad 222 as shown in FIG. 1D. Therefore, after filling the first opening 232 with conductive material, the conductive material filling an empty space surrounded by the ring-shape pad 222 and the ring-shape pad 222 together form a second via pad 222' as shown in FIG. 1E. In addition, the independent via pad 150 may be fabricated in such a way that the outer diameter of the independent via pad 150 is greater than that of the second via pad 222'. This may also increase the tolerance of alignment between the first circuit pattern 120 and the second circuit pattern 220 and improve the corresponding process yield.

Figure 2A:
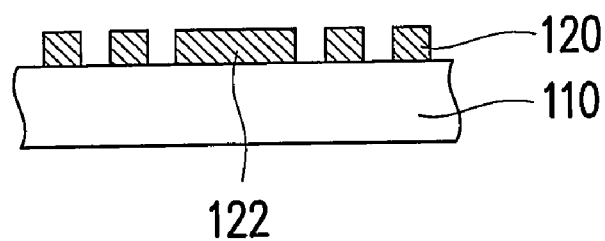
FIGS. 2A to 2E illustrate a process for fabricating the first composite-layer structure in FIG. 1A.

FIGS. 2A to 2E illustrate a process for fabricating the first composite-layer structure in FIG. 1A. As shown in FIG. 2A, a first circuit pattern 120 is formed on a first carrier substrate 110. In the present embodiment, the first circuit pattern 120 may be fabricated on the first carrier substrate 110 by performing an additive process, a semi-additive process or a subtractive process.

Figure 2B:
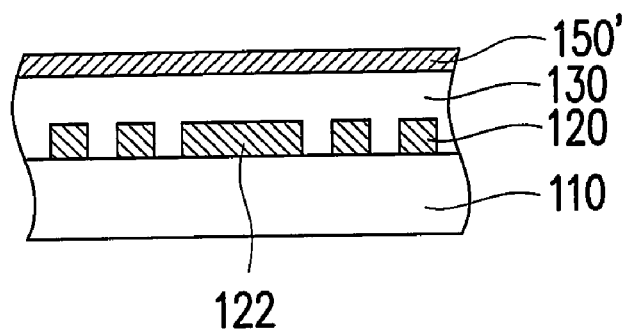

As show in FIG. 2B, a first dielectric layer 130 is formed over the first carrier substrate 110 and the first circuit pattern 120 and then a conductive layer 150' is formed on the first dielectric layer 130. In the present embodiment, the first dielectric layer 130 and the conductive layer 150' may be a prepreg and a copper foil respectively. In addition, the first dielectric layer 130 and the conductive layer 150' may be a composite layer such as a resin coated copper (RCC) composite layer.

Figure 2C:
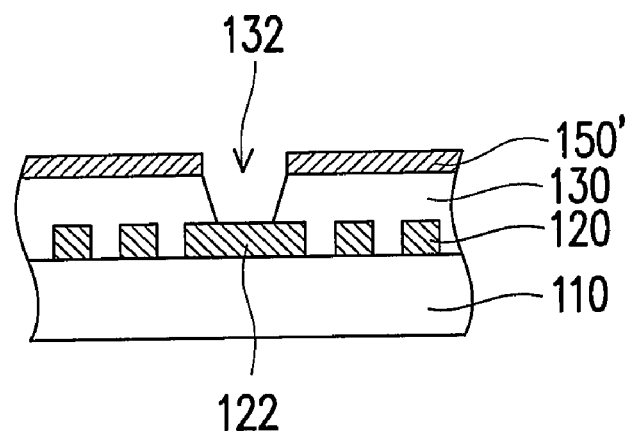

As shown in FIG. 2C, a second opening 132 that passes through the conductive layer 150' and the first dielectric layer 130 and exposes the first via pad 122 is formed. In the present embodiment, the method of forming the second opening 132 is performing a laser-drilling operation, for example.

Figure 2D:
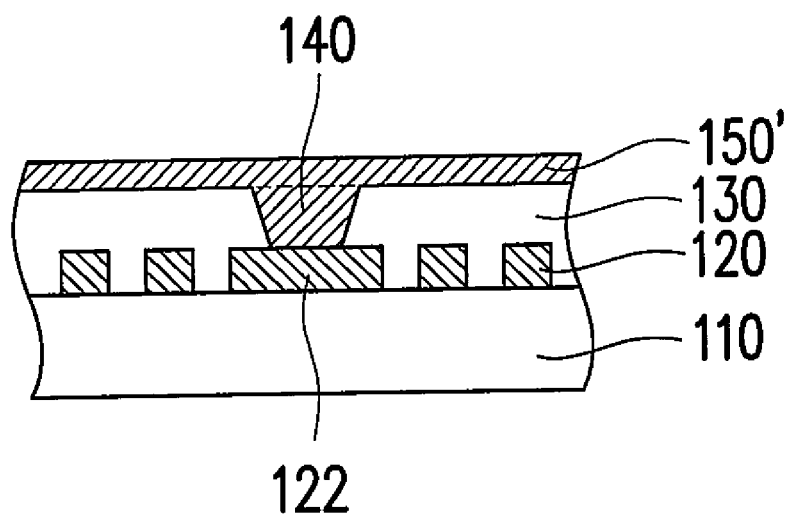

As shown in FIG. 2D, conductive material is used to fill the second opening 132 so as to form a first conductive via 140 that connects the first via pad 122 and the conductive layer 150'. In the present embodiment, the method of filling the opening 132 with conductive material is performing an electroplating process, for example.

Figure 2E:
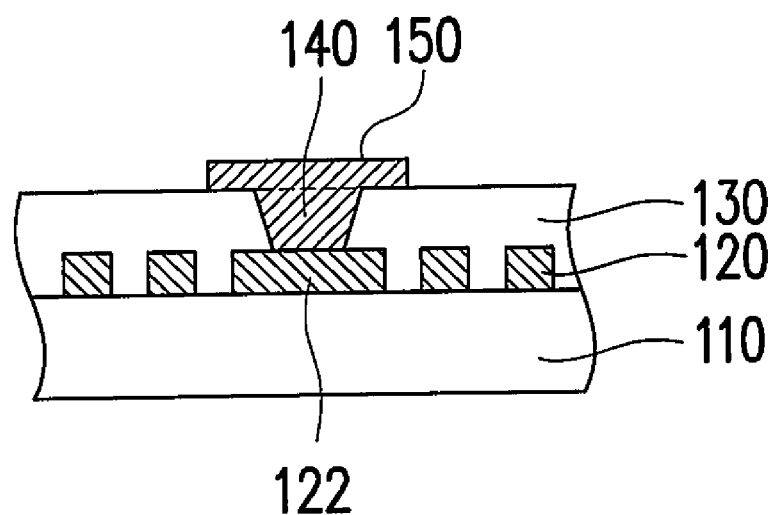

As shown in FIG. 2E, the conductive layer 150' is patterned to form an independent via pad 150. In the present embodiment, the step for patterning the conductive layer 150' includes performing an etching operation.

Figure 3A:
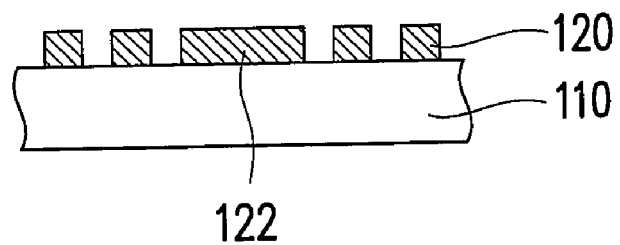
FIGS. 3A to 3F illustrate another process for fabricating the first composite-layer structure in FIG. 1A.

FIGS. 3A to 3F illustrate another process for fabricating the first composite-layer structure in FIG. 1A. As shown in FIG. 3A, a first circuit pattern 120 is formed on a first carrier substrate 110. In the present embodiment, the first circuit pattern 120 may be fabricated on the first carrier substrate 110 by performing an additive process, a semi-additive process or a subtractive process.

Figure 3B:
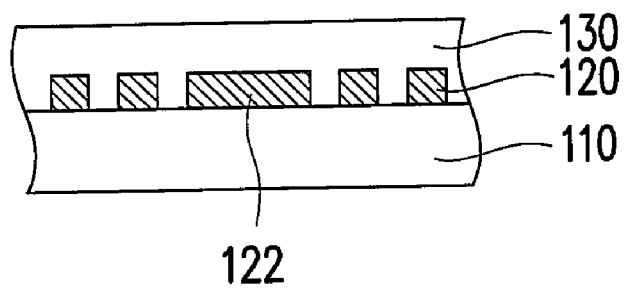

As show in FIG. 3B, a first dielectric layer 130 is formed over the first carrier substrate 110 and the first circuit pattern 120. In the present embodiment, the first dielectric layer 130 is formed, for example, by pressing a prepreg or coating a liquid phase dielectric material.

Figure 3C:
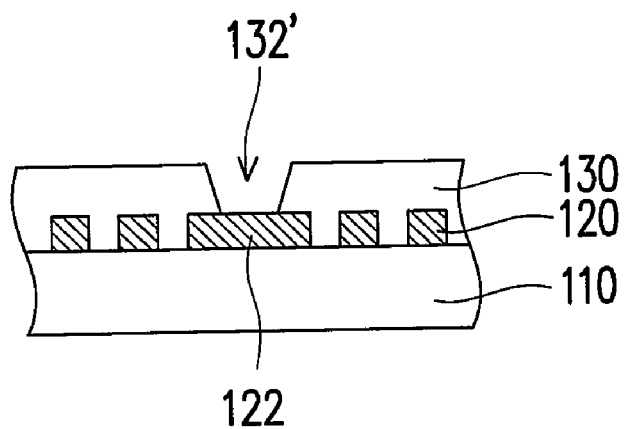

As shown in FIG. 3C, a second opening 132' that passes through the first dielectric layer and exposes the first via pad 122 is formed. In the present embodiment, the method of forming the second opening 132' is performing a laser-drilling operation, for example.

Figure 3D:
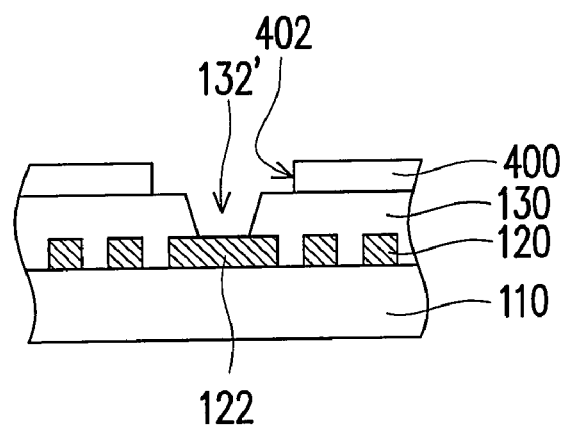

As shown in FIG. 3D, a patterned mask 400 is formed on the first dielectric layer 130. The patterned mask 400 has a mask opening 402 that exposes the second opening 132'. In the present embodiment, the patterned mask 400 may be a patterned photoresist layer.

Figure 3E:
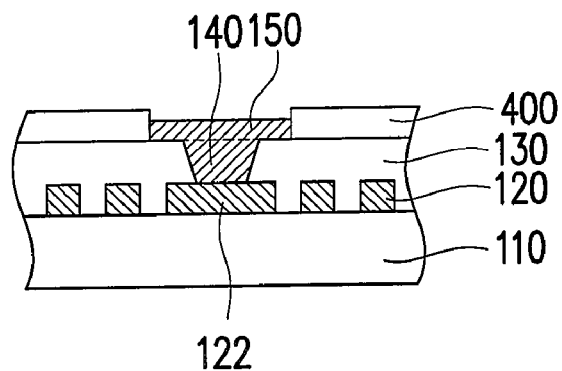

As shown in FIG. 3E, conductive material is used to fill the second opening 132' so as to form a first conductive via 140 that connects to the first via pad 122. In the present embodiment, the method of filling the second opening 132' with conductive material is performing an electroplating process, for example.

Also, as shown in FIG. 3E, conductive material is used to fill the mask opening 402 so as to form an independent via pad 150. In the present embodiment, the method of filling the mask opening 402 with conductive material is performing an electroplating process, for example. In addition, the first conductive via 140 and the independent via pad 150 may be formed integrally in a single process.

Figure 3F:
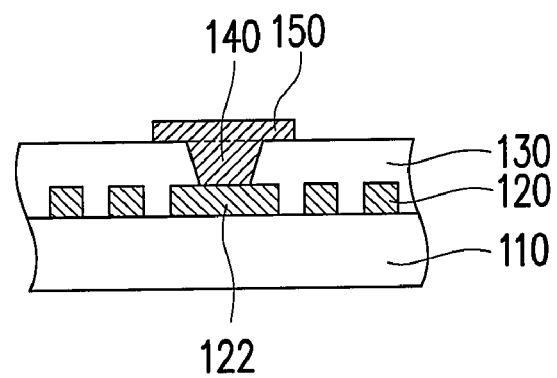

As shown in FIG. 3F, the patterned mask 400 is removed to expose a surface of the first dielectric layer 130 away from the first via pad 122.

Accordingly, the present invention fabricates a single conductive channel for electrically connecting two circuit patterns in different layer counts through a two-stage process. Hence, the conductive vias of a circuit structure may have a higher aspect ratio, thereby increasing the circuit density of the circuit structure or fitness to the design of special circuit structures.

In addition, the outer diameter of the independent via pad may be greater than the outer diameter of the via pad above or below the independent via pad so as to enhance the tolerance of alignment between two circuit patterns, one above and one below the independent via pad. As a result, the process yield of the circuit structure is increased and the heat dissipating capacity of the circuit structure is improved.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit structure, comprising:
   a first dielectric layer;
   a first circuit pattern, embedded in the first dielectric layer and having at least one first via pad;
   at least one first conductive via, passing through the first dielectric layer and connected to the first via pad;
   at least one independent via pad, disposed on a surface of the first dielectric layer away from the first via pad and connected to one end of the first conductive via away from the first via pad;
   a second dielectric layer, disposed over a surface of the first dielectric layer where the independent via pad is disposed;
   at least one second conductive via, passing through the second dielectric layer and connected to the independent via pad; and
   a second circuit pattern, embedded in the second dielectric layer and located at a surface of the second dielectric layer away from the independent via pad, wherein the second circuit pattern has at least one ring-shape pad exposed from the second dielectric layer and an empty space surrounded by the ring-shape pad is filled with conductive material such that the conductive material and the ring-shape pad together form at least one second via pad connected to the second conductive via, wherein a surface of the ring-shape pad, a surface of the conductive material and a surface of the second dielectric layer substantially form a plane, such that the surface of the ring-shape pad and the surface of the conductive material collectively form a surface of the second via pad.

2. The circuit structure as claimed in claim 1, wherein an outer diameter of the independent via pad is greater than an outer diameter of the first via pad.

3. The circuit structure as claimed in claim 1, wherein an outer diameter of the independent via pad is greater than an outer diameter of the second via pad.

4. The circuit structure as claimed in claim 1, wherein the first dielectric layer is a prepreg, a resin layer, or a coated layer of liquid phase dielectric material.

5. The circuit structure as claimed in claim 1, wherein the material of the first conductive via is electroplated material.

6. The circuit structure as claimed in claim 1, wherein the independent via pad surrounds the end of the first conductive via.

7. The circuit structure as claimed in claim 1, wherein the independent via pad is integrally formed with the first conductive via.

8. The circuit structure as claimed in claim 1, wherein the second conductive via passes through the second via pad and is exposed thereby.

9. The circuit structure as claimed in claim 1, wherein a boundary exists between the second circuit pattern and the second conductive via.

10. The circuit structure as claimed in claim 1, wherein the second dielectric layer is formed as an individual unit without any boundary in itself.

11. The circuit structure as claimed in claim 1, wherein the independent via pad has no connection with any conductive wires disposed on the surface of the first dielectric layer where the independent via pad is disposed.

12. The circuit structure as claimed in claim 11, wherein a boundary exists between the second circuit pattern and the second conductive via.

13. The circuit structure as claimed in claim 11, wherein the second dielectric layer is formed as an individual unit without any boundary in itself.

14. The circuit structure as claimed in claim 11, wherein there are no conductive wires disposed on the surface of the first dielectric layer.

15. The circuit structure as claimed in claim 14, wherein a boundary exists between the second circuit pattern and the second conductive via.

16. The circuit structure as claimed in claim 14, wherein the second dielectric layer is formed as an individual unit without any boundary in itself.

* * * * *

UNITED STATES PATENT AND TRADEMARK OFFICE
CERTIFICATE OF CORRECTION

PATENT NO. : 7,745,933 B2  Page 1 of 1
APPLICATION NO. : 11/739515
DATED : June 29, 2010
INVENTOR(S) : Cheng-Po Yu It is certified that error appears in the above-identified patent and that said Letters Patent is hereby corrected as shown below:

On the Title page, please replace item (73) Assignee's name from "United Microelectronics Corp., Hsinchu, Taiwan, R.O.C" to --Unimicron Technology Corp., Taoyuan, Taiwan, R.O.C.--

Signed and Sealed this
Twenty-seventh Day of September, 2011

David J. Kappos
*Director of the United States Patent and Trademark Office*